United States Patent [19]
Hodges et al.

[11] Patent Number: 5,260,229
[45] Date of Patent: Nov. 9, 1993

[54] METHOD OF FORMING ISOLATED REGIONS OF OXIDE

[75] Inventors: Robert L. Hodges, Euless; Frank R. Bryant, Denton; Fusen E. Chen, Dallas, Tex.; Che-Chia Wei, Plano, all of Tex.

[73] Assignee: SGS-Thomson Microelectronics, Inc., Carrollton, Tex.

[21] Appl. No.: 755,508

[22] Filed: Aug. 30, 1991

[51] Int. Cl.$^5$ ............................................. H01L 21/76
[52] U.S. Cl. .......................................... 437/69; 437/61; 437/62; 437/70
[58] Field of Search ..................... 437/61, 69, 70, 62

[56] References Cited

U.S. PATENT DOCUMENTS 4,755,477  7/1988  Chao .................................. 437/62

FOREIGN PATENT DOCUMENTS

| | | | |
|---|---|---|---|
| 0065445 | 4/1984 | Japan | 437/70 |
| 0161837 | 9/1984 | Japan | 437/70 |
| 0300526 | 12/1984 | Japan | 437/70 |
| 0293850 | 11/1988 | Japan | 437/70 |
| 0010836 | 1/1990 | Japan | 437/69 |

Primary Examiner—Brian E. Hearn
Assistant Examiner—Trung Dang
Attorney, Agent, or Firm—Lisa K. Jorgenson; Kenneth C. Hill; Richard K. Robinson

[57] ABSTRACT

A method is provided for forming isolated regions of oxide of an integrated circuit, and an integrated circuit formed according to the same. A pad oxide layer is formed over a portion of a substrate. A first silicon nitride layer is formed over the pad oxide layer. A polysilicon buffer layer is then formed over the first silicon nitride layer. A second silicon nitride layer is formed over the polysilicon layer. A photoresist layer is formed and patterned over the second silicon nitride layer. An opening is etched through the second silicon nitride layer and the polysilicon buffer layer to expose a portion of the first silicon nitride layer. A third silicon nitride region is then formed on at least the polysilicon buffer layer exposed in the opening. The first silicon nitride layer is etched in the opening. A field oxide region is then formed in the opening.

13 Claims, 1 Drawing Sheet

METHOD OF FORMING ISOLATED REGIONS OF OXIDE

This application is related to the U.S. application filed Jul. 31, 1991, Ser. No. 07/738,580, titled METHOD OF FORMING ISOLATED REGIONS OF OXIDE, which has been assigned to the assignee hereof and incorporated by reference herein.

1. Field of the Invention

The present invention relates generally to semiconductor integrated circuits, and more specifically to forming isolated regions of oxide.

2. Background of the Invention

The trend to continue to miniaturize semiconductor integrated circuits to achieve submicron feature sizes and increase the number of devices fabricated on the integrated circuit has required smaller isolation areas between devices. The active areas in which devices are built are isolated by a layer of oxide known as field oxide. However, the technology used to isolate active areas has not kept pace with the ever-decreasing device geometries.

Isolation techniques should meet a variety of requirements. First, active areas should be in close proximity. Second, the lateral encroachment or tapering of the field oxide into the active areas, known as "birdbeaking", should be minimized. Third, the leakage current between active devices should be negligible. Fourth, the process for forming the field oxide regions must be easily adapted for use with standard integrated circuit fabrication process flows and not adversely affect device parameters.

Many methods have been proposed over the years to reduce the bird's beak of a field oxide region when isolating devices. One such method of isolating devices, LOCOS, local oxidation of silicon, produces regions of insulating silicon dioxide between devices. The LOCOS process was a great technological improvement in reducing the area needed for the isolation regions and decreasing some parasitic capacitances.

In LOCOS, silicon nitride is deposited and patterned over a stress relief pad oxide layer. The silicon nitride layer is retained over the area over where further oxidation is not desired. Thus, the silicon nitride is etched to expose a portion of the pad oxide where the field oxide is to be grown. After the thermal oxidation of the exposed pad oxide to form the field oxide regions, the silicon nitride layer is removed.

Several problems occurred, however, with LOCOS. Thermal oxidation in the original LOCOS form always incurred lateral encroachment, or birdbeaking, of the field oxide into the active areas growing under the silicon nitride mask. This birdbeaking is a substantial sacrifice of active areas that becomes significant for feature sizes less than 1.5 microns. The active area becomes smaller than the initial dimensions of the nitride layer.

Attempts to suppress birdbeaking in LOCOS, such as forming thicker nitride layers, caused stress-related defects in the nearby substrate due to the difference in the thermal coefficients of expansion between the silicon substrate and the silicon nitride layers. Process complexity also increased substantially in attempting to avoid these stress-related defects. To achieve submicron geometries, there can be little or no physical loss of the active areas as occurs with the birdbeaking phenomenon.

To reduce the bird's beak effect, there has been proposed the use of a polysilicon layer between the nitride layer and the pad oxide layer as more fully described in U.S. Pat. No. 4,407,696, issued Oct. 4, 1983 to Han et al. The use of the polysilicon layer in the LOCOS process, known as poly-buffered LOCOS or PBLOCOS, is used to reduce oxidation induced stacking faults resulting from the stress caused by the different thermal coefficients of expansion between the silicon substrate and a thick silicon nitride layer overlying the substrate. As described more fully in the publication "Twin-White-Ribbon Effect and Pit Formation Mechanism in PBLOCOS", J. Electrochem. Soc., Vol 138, No. 7, July 1991 by Tin-hwang Lin et al, the polysilicon layer absorbs the excessive stress caused by the silicon nitride and prevents the lateral encroachment of oxidants, thus reducing the bird's beak.

The field oxide layer grown using poly-buffered LOCOS thus comprises the oxide derived from the silicon substrate, a portion of the pad oxide layer and oxide derived from the polysilicon layer. Afterwards, the nitride layer, the polysilicon layer and the pad oxide are etched. The poly-buffered LOCOS process reduces the bird's beak area over standard LOCOS resulting in less encroachment of the tapered portion of the field oxide into the active areas under the nitride mask. However, the bird's beak effect still remains, due to the oxidation of the polysilicon layer. In addition, the complexity of the process increases substantially in order to achieve the resulting structure.

In order to further decrease the bird's beak area using poly-buffered LOCOS, the present invention surrounds the polysilicon layer with silicon nitride. As with standard poly-buffered LOCOS, the stress caused between the thick nitride layer over a thin pad oxide and the silicon substrate is reduced by the addition of the polysilicon layer. In the present invention, the bird's beak is further reduced due to the encapsulation of the polysilicon in silicon nitride. The oxidation of the polysilicon is reduced or eliminated. None of the polysilicon layer thus forms any part of the thermally grown field oxide. The resulting bird's beak is thus substantially reduced.

SUMMARY OF THE INVENTION

The invention may be incorporated into a method for forming an integrated circuit, and the integrated circuit formed thereby, by forming isolated regions of oxide. A protective layer is formed over a portion of a substrate. A polysilicon buffer layer with an opening therethrough is formed over the protective layer and encapsulated in silicon nitride. The protective layer is etched in the opening. A field oxide region is then formed in the opening.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
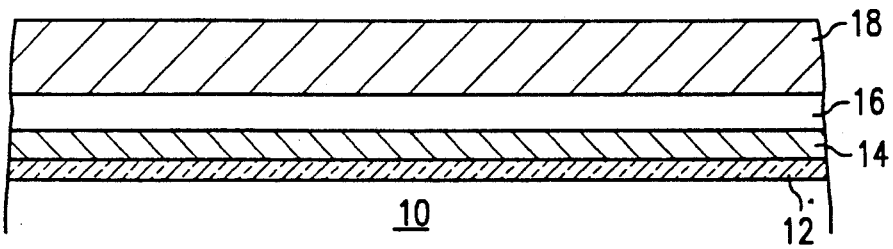
FIGS. 1–3B are cross-sectional views of the fabrication of a semiconductor device structure according to the present invention.

Referring to FIG. 1, an integrated circuit is to be formed on a silicon substrate 10. A stress relief pad oxide layer 12 is grown over the substrate 10. The pad oxide layer 12 will typically have a thickness of between approximately 10 to 300 angstroms. A first silicon nitride layer ($Si_3N_4$) 14 may formed over the oxide layer 12. Layer 14 will typically have a thickness of between approximately 10 to 200 angstroms. Layer 14 may be formed by chemical vapor deposition as is known in the art or by rapid thermal nitridation (RTN) of the oxide layer 12. RTN of the oxide layer will result in a smaller pad oxide layer 12 under the first silicon nitride layer 14.

A polysilicon buffer layer 16 is then deposited over the first silicon nitride layer 14 having a thickness of between approximately 50 to 1000 angstroms. A second silicon nitride layer 18 is deposited over the polysilicon buffer layer 16. The second nitride layer 18 has a thickness of between approximately 500 to 3000 angstroms.

Figure 2A:
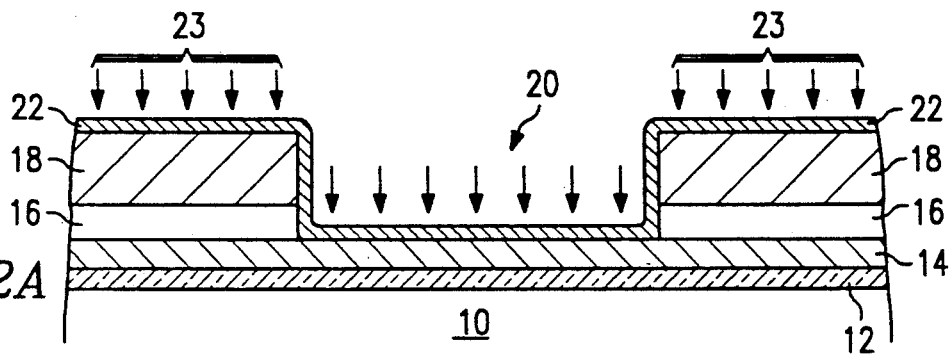

Referring to FIG. 2A, an opening 20 is etched through the second silicon nitride layer 18 and the polysilicon layer 16 to define an area in which the isolation or field oxide region is to be manufactured. The opening may be further etched through the first silicon nitride layer 14 and the oxide layer 12. However, there is an advantage in retaining at least the oxide layer 12 in that it acts as an etch stop for the second silicon nitride layer 18 and the polysilicon layer 16.

At this stage, if the first nitride layer 14 is also etched away or if layer 14 and the oxide layer 12 are etched away, an implant into the silicon substrate 10 may be done to form a channel stop. If an implant is done, as represented by the arrows 23, the ions will have sufficient energy to penetrate into the silicon substrate 10 but will not have sufficient energy to penetrate the second nitride layer 18, thus the implant will occur only through the opening 20. A third silicon nitride layer 22 is then formed on at least the polysilicon buffer layer 16 exposed in the opening 20. As shown in FIG. 2A, layer 22 may be deposited so as to form over layer 18 and in the opening 20 and may typically have a thickness of between approximately 30 to 500 angstroms.

Figure 2B:
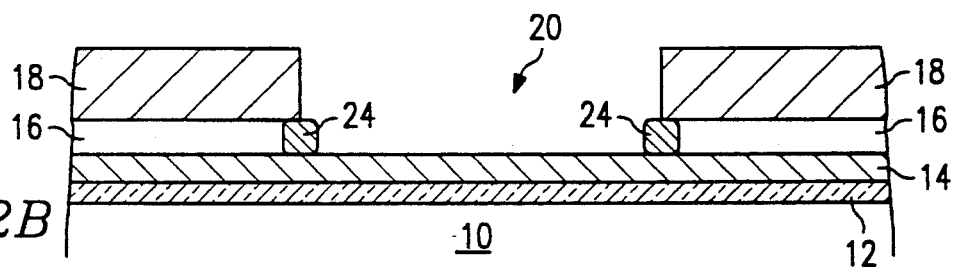

Referring to FIG. 2B, the third silicon nitride layer may alternatively be formed by rapid thermal nitridation (RTN) of the exposed portion of the polysilicon layer 16 in the opening. RTN of the exposed portion of polysilicon layer 16 will cause formation of silicon nitride regions 24. If the first silicon nitride layer 14 was etched away during formation of opening 20, the RTN process will form silicon nitride on the upper surface of the oxide layer 12. Likewise, if the oxide layer 12 was etched away during the formation of opening 20, the RTN process will form a layer of silicon nitride on the surface of the silicon substrate 10.

Figure 3A:
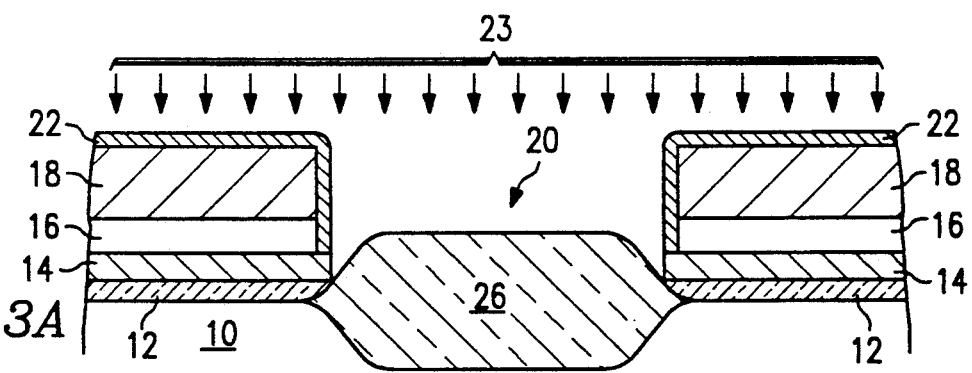

Referring to FIG. 3A following from FIG. 2A, the third silicon nitride layer 22, the first silicon nitride layer 14 and the pad oxide layer 12 are etched away in opening 20 to expose the silicon substrate 10. Alternatively, the oxide layer 12 may remain in opening 20. At this stage, if an implant to form a channel stop has not been previously performed, the implant may be done as represented by the arrows 23. Field oxide region 26 is then thermally grown in opening 20 which includes a portion of the silicon substrate 10. If the oxide layer 12 was not etched away, the field oxide region 26 will also include the oxide layer 12 in opening 20.

Figure 3B:
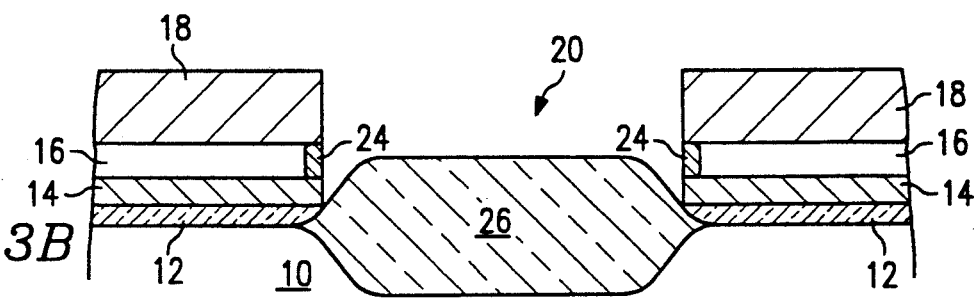

Referring to FIG. 3B following from FIG. 2B, the silicon nitride regions 24, the first silicon nitride layer 14 and the oxide layer 12 are etched away in opening 20. The silicon nitride regions 24 recessed into the polysilicon layer 16 will remain thus encapsulating the polysilicon layer 14 in silicon nitride. Again, the oxide layer 12 may remain and a channel stop may be implanted. Field oxide region 26 is then thermally grown in opening 20.

The polysilicon layer 16 is encapsulated by silicon nitride. The first silicon nitride layer 14 is formed underneath layer 16. A thicker second silicon nitride layer 18 is formed over layer 16 and the third silicon nitride layer 22 is formed on the end of layer 16 exposed in the opening 20. Encapsulating the polysilicon buffer layer 16 in silicon nitride prevents the polysilicon from oxidizing during growth of the field oxide region 26. While the first silicon nitride layer 14 is thin enough so that no additional stress is caused to the silicon substrate, the polysilicon layer 16 acts to relieve stress between the thicker nitride layer 18 and the silicon substrate 10. The polysilicon layer further prevents the thicker nitride layer 18 from inducing defects in the silicon substrate.

In addition, penetration of the grown oxide beneath the nitride layer 14 is reduced. The bird's beak area is thus substantially reduced due to the inability of the polysilicon to oxidize during the growth of the field oxide region. The nitride layers and the polysilicon buffer layer may then be removed to expose the active areas underneath.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. A method of forming isolated regions of oxide on an integrated circuit, comprising the steps of:
   forming a pad oxide layer over a portion of a substrate;
   forming a first silicon nitride layer over the pad oxide layer, wherein the first silicon nitride layer has a first thickness thin enough to prevent stress to the substrate;
   forming a polysilicon buffer layer over the first silicon nitride layer;
   forming a second silicon nitride layer over the polysilicon buffer layer, wherein the second silicon nitride layer has a second thickness substantially thicker than the first thickness;
   forming and patterning a photoresist layer over the second silicon nitride layer;

etching an opening through the second silicon nitride layer and polysilicon buffer layer to expose a portion of the first silicon nitride layer;

forming a third silicon nitride region on at least the polysilicon buffer layer exposed in the opening; and, forming a field oxide region in the opening.

2. The method of claim 1, wherein the thickness of the pad oxide layer is between approximately 10 to 300 angstroms.

3. The method of claim 1, wherein the first silicon nitride layer has a thickness of between approximately 10 to 200 angstroms.

4. The method of claim 3, wherein the first silicon nitride layer is formed by chemical vapor deposition.

5. The method of claim 3, wherein the first silicon nitride layer is formed by rapid thermal nitridation of an upper portion of the pad oxide layer.

6. The method of claim 1, wherein the polysilicon buffer layer is between approximately 50 to 1000 angstroms.

7. The method of claim 1, wherein the thickness of the second silicon nitride layer is between approximately 500 to 3000 angstroms.

8. The method of claim 1, wherein the second silicon nitride layer is formed by chemical vapor deposition.

9. The method of claim 1, wherein the third silicon nitride region is formed by depositing between approximately 30 to 100 angstroms of silicon nitride over the second silicon nitride layer and in the opening.

10. The method of claim 1, wherein the third silicon nitride region is formed by rapid thermal nitridation of the polysilicon buffer layer exposed in the opening.

11. The method of claim 1, further comprising the step of:

etching the first silicon nitride layer during the etching the opening step exposing the pad oxide layer in the opening, and wherein the third silicon nitride region is formed by rapid thermal nitridation of the polysilicon buffer layer and the pad oxide layer exposed in the opening.

12. The method of claim 1, further comprising the step of:

etching the first silicon nitride layer and the pad oxide layer during the etching the opening step exposing the substrate in the opening, and wherein the third silicon nitride region is formed by rapid thermal nitridation of the polysilicon buffer layer and the substrate exposed in the opening.

13. The method of claim 1, wherein the thickness of the field oxide region is between approximately 2000 to 8000 angstroms.

* * * * *